(12) United States Patent
Sudou et al.

(10) Patent No.: US 7,224,193 B2
(45) Date of Patent: May 29, 2007

(54) CURRENT-VOLTAGE CONVERSION CIRCUIT

(75) Inventors: Minoru Sudou, Chiba (JP); Mitsuo Yarita, Chiba (JP); Kenji Kato, Chiba (JP)

(73) Assignee: Seiko Instruments Inc. (JP)

( * ) Notice: Subject to any disclaimer, the term of this patent is extended or adjusted under 35 U.S.C. 154(b) by 29 days.

(21) Appl. No.: 11/127,017

(22) Filed: May 11, 2005

(65) Prior Publication Data

US 2005/0253628 A1  Nov. 17, 2005

(30) Foreign Application Priority Data

May 12, 2004  (JP)  ............................. 2004-141942
Feb. 15, 2005  (JP)  ............................. 2005-038180

(51) Int. Cl.
*H02M 11/00*  (2006.01)

(52) U.S. Cl. ...................................... 327/103; 327/561
(58) Field of Classification Search ................. 327/103
See application file for complete search history.

(56) References Cited

U.S. PATENT DOCUMENTS 6,133,766 A * 10/2000 Pulvirenti et al. .......... 327/103
6,160,435 A * 12/2000 Kim ............................ 327/336

* cited by examiner

*Primary Examiner*—Long Nguyen
*Assistant Examiner*—Ryan C. Jager
(74) *Attorney, Agent, or Firm*—Adams & Wilks

(57) ABSTRACT

A CV conversion circuit capable of measuring a plurality of capacitances with a simple circuit is provided. A time-division signal is applied to each capacitor, whereby a plurality of capacitances of the capacitors can be measured in series by a circuit with a small number of components.

16 Claims, 5 Drawing Sheets

US 7,224,193 B2

CURRENT-VOLTAGE CONVERSION CIRCUIT

BACKGROUND OF THE INVENTION

1. Field of the Invention

The present invention relates to a current-voltage (CV) conversion circuit for converting a plurality of capacitance values into respective voltages.

2. Description of the Related Art

FIG. 7 shows a conventional CV conversion circuit (refer to FIG. 2 in JP 2001-124807A for example).

In this configuration a conventional CV conversion circuit includes an operational amplifier 1 having a grounded noninverting input terminal, a resistor 3 connected between an output terminal and an inverting input terminal of the operational amplifier 1, and a capacitor 2, whose capacitance value to be detected, having one end connected to the inverting input terminal of the operational amplifier 1 and the other end connected to a signal voltage source 4. The signal voltage source 4 has a signal having certain voltage amplitude V and a certain angular frequency ω. The signal voltage $V_s$ of the signal voltage source 4 is expressed by Eq. (1):

$$V_s = V \cdot \sin(\omega t) \quad (1)$$

Since the inverting input terminal of the operational amplifier 1 is virtually grounded in FIG. 7, an electric potential at the inverting input terminal is equal to a ground electric potential at the noninverting input terminal. Let the ground electric potential be 0 V, and denoting a capacitance value of the capacitor 2 as C, a current I flowing through the capacitor 2 is expressed by Eq. (2):

$$I = j\omega C \cdot V \cdot \sin(\omega t) \quad (2)$$

A voltage having amplitude $V_o$ expressed by Eq. (3) is thus generated at an output terminal 5 of the operational amplifier 1:

$$V_o = -j\omega CR \cdot V \cdot \sin(\omega t) \quad (3)$$

where R is a resistance value of the resistor 3.

As apparent from Eq. (3), the amplitude $V_o$ of the output voltage of the operational amplifier 1 is proportional to the capacitance value C of the capacitor 2. Hence, the capacitance value C of the capacitor 2 can be measured by measuring the amplitude $V_o$ of the output voltage.

FIGS. 8A, 8B and 8C are waveforms of voltage and current over time in respective portions of the CV conversion circuit. FIG. 8A shows a waveform of the signal voltage of the signal voltage source 4. A sine wave is given in this case. FIG. 8B shows a waveform of the current flowing through the capacitor 2 and the resistor 3, and FIG. 8C shows a voltage waveform appearing at the output terminal 5 of the operational amplifier 1.

When the capacitances of a plurality of capacitors are measured, the same number of the circuits, each shown in FIG. 7, as capacitors to be measured is needed, thereby allowing the plurality of plurality of capacitances to be measured.

The conventional CV conversion circuit involves a problem that the same number of CV conversion circuits as capacitors to be measured are required, and the scale of the circuit hence increases when the plurality of capacitances are measured.

SUMMARY OF THE INVENTION

In light of the foregoing, the present invention has been made in order to solve the abovementioned problem, and an object of the present invention is to measure a plurality of capacitances with a small circuit.

The present invention provides a CV conversion circuit including: an operational amplifier having an inverting input terminal and an output terminal connected to each other; a resistor having one end connected to a noninverting input terminal of the operational amplifier and the grounded other end; a first capacitor having one end connected to the noninverting input terminal of the operational amplifier and the other end connected to a first signal voltage source; a second capacitor having one end connected to the noninverting input terminal of the operational amplifier and the other end connected to an inverting output of the first signal voltage source; a third capacitor having one end connected to the noninverting input terminal of the operational amplifier and the other end connected to a second signal voltage source; and a fourth capacitor having one end connected to the noninverting input terminal of the operational amplifier and the other end connected to an inverting output of the second signal voltage source, in which the first signal voltage source and the second signal voltage source generate signal pulses in a time division manner, and detection is carried out synchronously with the signal pulses.

Further, a CV conversion circuit, includes: an operational amplifier having an inverting input terminal and an output terminal connected to each other; a resistor having one end connected to a noninverting input terminal of the operational amplifier and the grounded other end; a first capacitor having one end connected to the noninverting input terminal of the operational amplifier and the other end connected, to a first signal voltage source; a second capacitor having one end connected to the noninverting input terminal of the operational amplifier and the other end connected to an inverting output of the first signal voltage source; and a third capacitor having one end connected to the noninverting terminal of the operational amplifier and the other end connected to a second signal voltage source, in which the first signal voltage source and the second signal voltage source generate signal pulses in a time division manner, and detection is carried out synchronously with the signal pulses.

Further a CV conversion circuit, includes: an operational amplifier having an inverting input terminal and an output terminal connected to each other; a resistor having one end connected to a noninverting input terminal of the operational amplifier and the grounded other end; a first capacitor having one end connected to the noninverting input terminal of the operational amplifier and the other end connected to a first signal voltage source; a second capacitor having one end connected to the noninverting input terminal of the operational amplifier and the other end connected to a second signal voltage source; and a third capacitor having one end connected to the noninverting input terminal of the operational amplifier and the other end connected to an inverting output terminal of the second signal voltage source, in which the first signal voltage source and the second signal voltage source generate signal pulses in a time division manner, and detection is carried out synchronously with the signal pulses.

Further a CV conversion circuit, includes: an operational amplifier having an inverting input terminal and an output terminal connected to each other; a resistor having one end connected to a noninverting input terminal of the operational amplifier and the grounded other end; a first capacitor having one end connected to the noninverting input terminal of the operational amplifier and the other end connected to a first signal voltage source; and a second capacitor having one end connected to the noninverting input terminal of the operational amplifier and the other end connected to a second signal voltage source, in which the first signal voltage source and the second signal voltage source generate signal pulses in a time division manner, and detection is carried out synchronously with the signal pulses.

Moreover, in the above-mentioned CV conversion circuit the number of signal voltage sources is equal to or larger than three, and the number of capacitors connected to the signal voltage sources, respectively, is equal to or larger than three.

Moreover, in the CV conversion circuit when a sum of the total capacitances of the capacitors connected to the inverting input terminal of the operational amplifier is C, and a resistance value of the resistor is R, a value of a time constant CR is smaller than a pulse duration of each of the signal pulses from the first and the second signal voltage sources.

Moreover, in the CV conversion circuit a resistance value of the resistor is changed synchronously with driving voltages from the signal voltage sources.

Moreover, in the CV conversion circuit amplitude voltage values of the signal voltage sources are different from each other.

The CV conversion circuit according to the present invention offers an effect in which a plurality of capacitances of capacitors can be measured with a small number of circuits.

DESCRIPTION OF THE PREFERRED EMBODIMENTS

In the present invention in order to solve the abovementioned problem in a CV conversion circuit, a time-divided signal pulse is applied to a plurality of capacitors having respective capacitance values to be measured. Moreover, a resistance value of a resistor is changed synchronously with a driving voltage.

Preferred embodiments of the present invention will hereinafter be described with reference to the accompanying drawings.

First Embodiment

Figure 1:
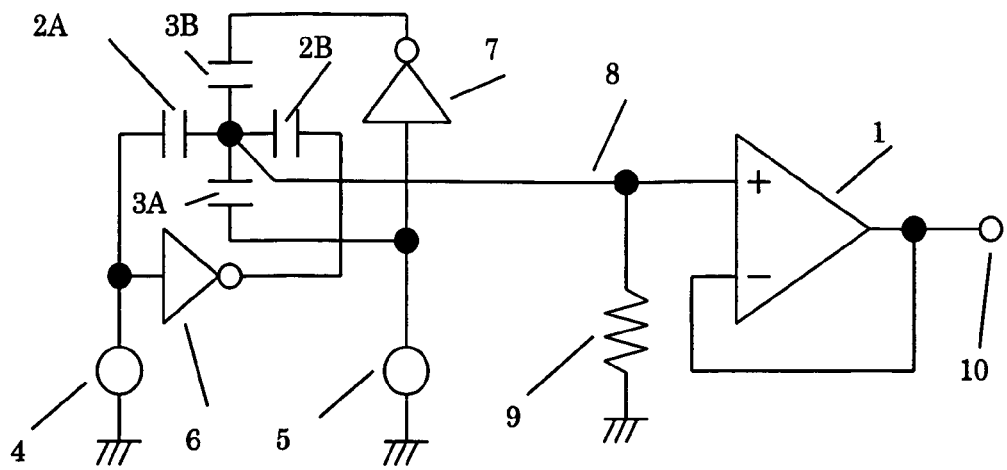
FIG. 1 is a circuit diagram of a CV conversion circuit according to a first embodiment of the present invention.

FIG. 1 is a circuit diagram of a CV conversion circuit having two CV conversion units according to a first embodiment of the present invention. The CV conversion circuit has a first capacitor 2A and a second capacitor 2B. One of the first capacitor 2A or the second capacitor 2B is a reference capacitor, and the other is a capacitor to be measured. The CV conversion circuit has also a third capacitor 3A and a fourth capacitor 3B. Similarly, one of the third capacitor 3A or the fourth capacitor 3B is a reference capacitor, and the other is a capacitor to be measured.

One ends of all the above-mentioned four capacitors 2A, 2B, 3A and 3B are connected to a common node which is connected to a noninverting input terminal of an operational amplifier 1. The operational amplifier 1 is a voltage follower in which an output terminal 10 and an inverting input terminal are connected to each other. One end of a resistor 9 is connected to the noninverting input terminal of the operational amplifier 1, and the other end of the resistor 9 is grounded.

The other end of the first capacitor 2A is connected to a first signal voltage source 4. An input of an inverter 6 is connected to the first signal voltage source 4, and an output of the inverter 6 is connected to the other end of the second capacitor 2B. That is, the first capacitor 2A and the second capacitor 2B are driven in opposite phases. The first and second capacitors 2A and 2B, the first signal voltage source 4 and the inverter 6 constitute a first CV conversion unit that is connected to the common node (common output terminal) which is connected to the noninverting input terminal of the operational amplifier 1.

The other end of the third capacitor 3A is connected to a second signal voltage source 5. An input of an inverter 7 is connected to the second signal voltage source 5, and an output of the inverter 7 is connected to the other end of the fourth capacitor 3B. That is, the third capacitor 3A and fourth capacitor 3B are driven in opposite phases. The third and fourth capacitors 3A and 3B, the second signal voltage source 5 and the inverter 7 constitute a second CV conversion unit that, like the first CV conversion unit, is connected to the common node (common output terminal) which is connected to the noninverting input terminal of the operation amplifier 1.

FIGS. 2A to 2K are waveforms of voltages in respective portions of the CV conversion circuit shown in FIG. 1, in which the horizontal axis represents time.

Figure 2:
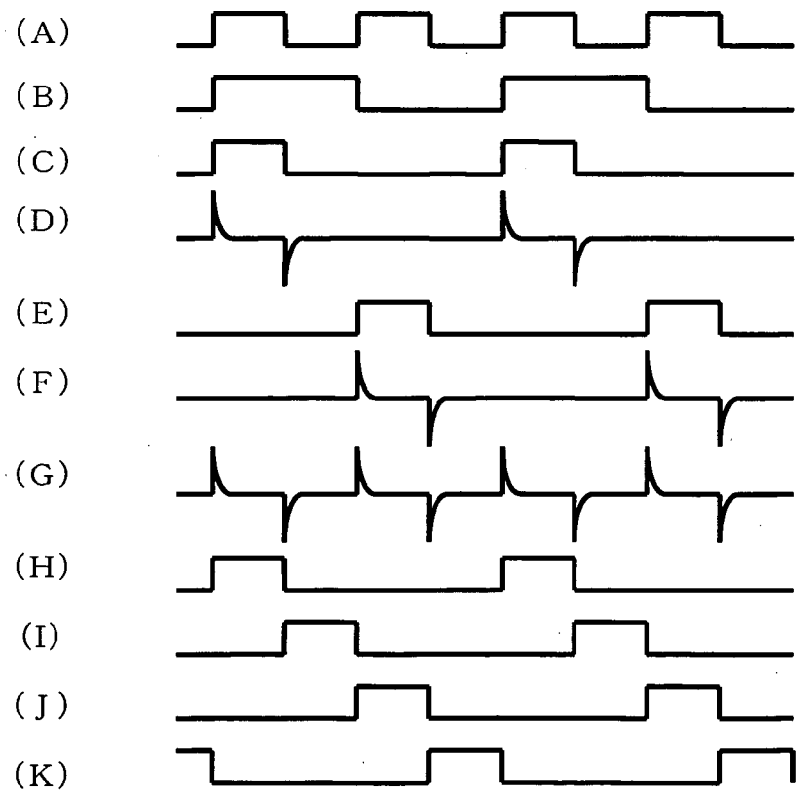
FIGS. 2A to 2K are waveforms of voltages in the CV conversion circuit according to the first embodiment of the present invention.

FIG. 2A shows a waveform of a clock signal as a basis for the first signal voltage source 4 and the second signal voltage source 5. FIG. 2B shows a wave form obtained by frequency-dividing the clock signal shown in FIG. 2A. FIG. 2C shows a wave form of an output voltage from the first signal voltage source 4. The waveform can be simply generated by taking AND of the signals shown in FIGS. 2A and 2B. FIG. 2D shows a waveform of output voltage which appears at the output terminal 10 of the operational amplifier 1 when the first capacitor 2A and the second capacitor 2B are driven by the output voltage having the waveform shown in FIG. 2C.

Now, when a capacitance of the first capacitor 2A is $C_{2A}$ and a capacitance of the second capacitor 2B is $C_{2B}$, a difference obtained by subtracting the capacitance $C_{2B}$ from the capacitance $C_{2A}$ is $C_X$, i.e., the difference $C_X$ is defined by $C_X = C_{2A} - C_{2B}$.

The waveform of the output voltage shown in FIG. 2D depends on the difference $C_X$. Thus, when the difference $C_X$ is positive, as shown in FIG. 2D, an upward spike is generated at a rising edge of the output voltage shown in FIG. 2C. On the other hand, when the difference $C_X$ is negative, a downward spike is generated at a rising edge of the output voltage shown in FIG. 2C conversely to FIG. 2D.

The height of the spike shown in FIG. 2D depends on the difference $C_x$ if the amplitude of the signal of the first signal voltage source 4 and the amplitude of the power voltage for the inverter 6, i.e., the amplitude of the signal to the second capacitor, are constant. When the difference $C_x$ is large, the height of the spike is large, while when the difference $C_x$ is small, the height of the spike is small.

That is, the CV conversion can be carried out by measuring the spike.

In addition, when a total capacitance of the noninverting input terminal of the operational amplifier 1 is $C_T$ and the resistance of the resistor 9 is R, the waveform of the spike in FIG. 2D follows a discharging curve with a time constant $C_T$·R.

Here, in a case when the time constant is longer than a time period (driving pulse duration) for which a level of the output voltage shown in FIG. 2C is held at "H", the voltage at the output terminal 10 of the operational amplifier 1 does not reach the ground voltage at a time when the level of the output voltage shown in FIG. 2C drops from "H" to "L", and accordingly a measurement error occurs. Thus, the value of the time constant $C_T$·R needs to be smaller than a pulse duration when the first capacitor 2A and the second capacitor 2B are driven by the first signal voltage source 4.

FIG. 2E shows a waveform of an output voltage from the second signal voltage source 5 shown in FIG. 1. The waveform of the output voltage from the second signal voltage source 5 can be simply generated by taking AND of the signal shown in FIG. 2A and a signal obtained by logically inverting the signal shown in FIG. 2B. FIG. 2F shows a waveform of output voltage which appears at the output terminal 10 of the operational amplifier 1 when the third capacitor 3A and the fourth capacitor 3B are driven by the voltage whose waveform is shown in FIG. 2E.

Now, when a capacitance of the third capacitor 3A is $C_{3A}$ and a capacitance of the fourth capacitor 3B is $C_{3B}$, a difference obtained by subtracting the capacitance $C_{3B}$ from the capacitance $C_{3A}$ is Cy, i.e., the difference Cy is defined by $Cy=C_{3A}-C_{3B}$. The waveform of the output signal shown in FIG. 2F depends on the difference Cy similarly to the case of FIG. 2C.

FIG. 2G shows a waveform of an output voltage which appears at the output terminal 10 of the operational amplifier 1 when the first capacitor 2A and the second capacitor 2B, and the third capacitor 3A and the fourth capacitor 3B are driven by the first signal voltage source 4 and the second signal voltage source 5, respectively. The waveform of FIG. 2G is a sum of the waveforms of FIGS. 2D and 2F.

FIGS. 2H to 2K show signals used to detect the waveform of the voltage at the output terminal 10 of the operational amplifier 1. The signal shown in FIG. 2H is the same as that shown in FIG. 2C and thus can be simply generated by taking AND of the signals of FIGS. 2A and 2B. The signal shown in FIG. 2I can be simply generated by taking AND of a signal obtained by logically inverting the signal of FIG. 2A and the signal of FIG. 2B. The signal shown in FIG. 2J is the same as that of FIG. 2E and can be simply generated by taking AND of the signal of FIG. 2A and a signal obtained by logically inverting the signal of FIG. 2B. The signal shown in FIG. 2K can be simply generated by taking AND of a signal obtained by logically inverting the signal of FIG. 2A and a signal obtained by logically inverting the signal of FIG. 2B.

Figure 3:
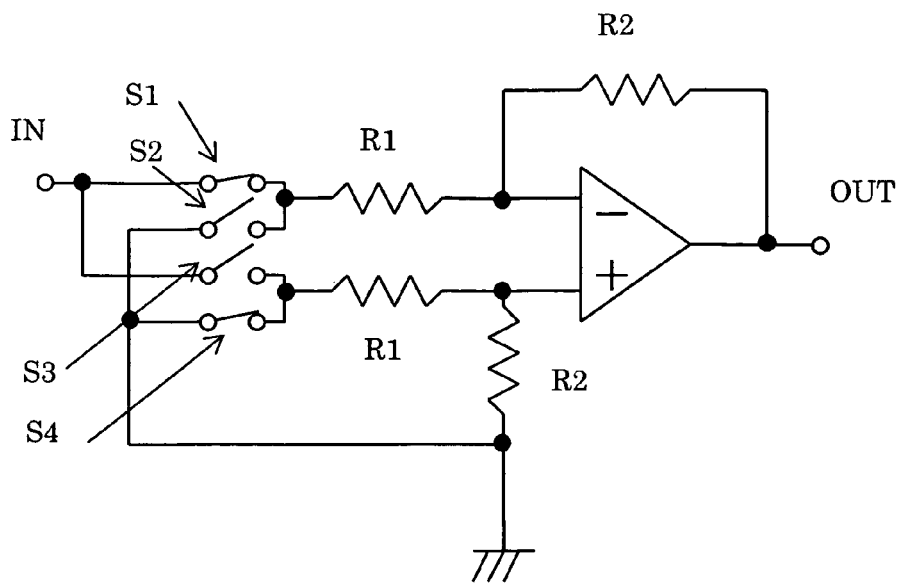
FIG. 3 is a circuit diagram of an example of a synchronous detection circuit.

FIG. 3 shows an example of a synchronous detection circuit. The synchronous detection circuit includes switches S1 to S4. The pair of switches S1 and S3, and the pair of switches S2 and S4 complementarily turn ON/OFF. That is, when the switch S1 is turned ON, the switch S3 is turned OFF, and when the switch S2 is turned OFF, the switch S4 is turned ON.

The output terminal 10 of the operational amplifier 1 is connected to an input terminal IN of the synchronous detection circuit shown in FIG. 3.

The number of synchronous detection circuits of FIG. 3 must be the same as the number of capacitors to be detected.

Now, in order to measure the capacitance difference $C_X$ between the capacitance of the first capacitor 2A and the capacitance of the second capacitor 2B, the switches S2 and S3 are turned ON (the switches S1 and S4 are turned OFF) when the level of the signal shown in FIG. 2H is at "H", and the switches S1 and S4 are turned ON (the switches S2 and S3 are turned OFF) when the level of the signal shown in FIG. 2I is at "H".

Consequently, the output signal from the operational amplifier 1 which is generated by the capacitance difference $C_X$ between the first capacitor 2A and the second capacitor 2B can be detected.

In order to detect the capacitance difference Cy between the capacitance of the third capacitor 3A and the capacitance of the fourth capacitor 3B by using another synchronous detection circuit, the switches S2 and S3 are turned ON (the switches S1 and S4 are turned OFF) when the level of the signal shown in FIG. 2J is at "H", and the switches S1 and S4 are turned ON (the switches S2 and S3 are turned OFF) when the level of the signal shown in FIG. 2K is at "H".

In this manner, the output signal from the operational amplifier 1 which is generated by the capacitance difference Cy between the third capacitor 3A and the fourth capacitor 3B can be detected.

After the synchronous detection, the output signal at the OUT terminal shown in FIG. 3 goes through a low-pass filter if necessary and is amplified if necessary, thereby making the CV conversion possible.

Consequently, two capacitances can be measured with one operational amplifier and one resistor.

Note that, in the above-mentioned description, for the sake of simplicity, it has been described that one of the capacitance of the first capacitor 2A or the capacitance of the second capacitor 2B is a reference capacitance, and the other is a capacitance to be detected, and similarly, one of the capacitance of the third capacitor 3A and the capacitance of the fourth capacitor 3B is a reference capacitance and the other is a capacitance to be detected. It is, however, obvious that this circuit is in principle a circuit for detecting the capacitance difference between the capacitance of the first capacitor 2A and the capacitance of the second capacitor 2B, or the capacitance difference between the capacitance of the third capacitor 3A and the capacitance of the fourth capacitor 3B, and thus one of the capacitance can not necessarily be a reference.

In addition, while in the above explanation it is shown that a capacitance difference between one pair of capacitors can be detected, it is obvious that even if one of the two capacitors does not exist, that is, one of the two capacitances is zero; the remained capacitance can be detected in the form of a capacitance difference.

Second Embodiment

Figure 4:
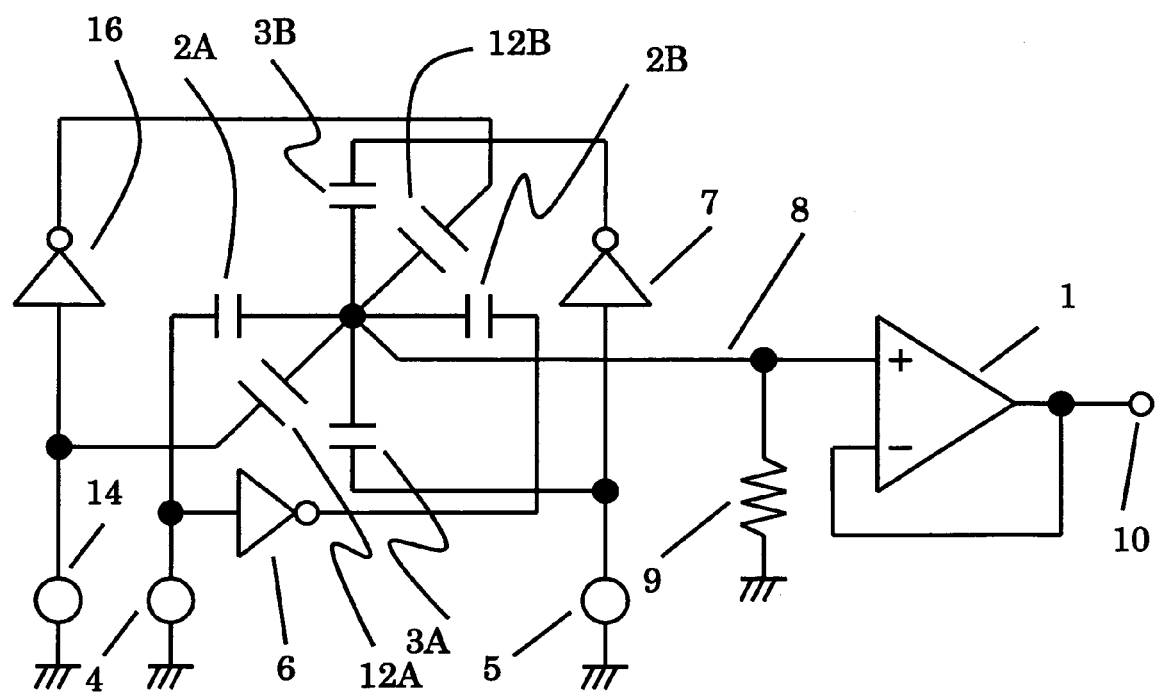
FIG. 4 is a circuit diagram of a CV conversion circuit according to a second embodiment of the present invention.

FIG. 4 is a circuit diagram of a CV conversion circuit having three CV conversion units according to a second embodiment of the present invention. A point of difference in configuration from the CV conversion circuit shown in FIG. 1 is that one ends of a fifth capacitor 12A and a sixth capacitor 12B are connected to the common node which is connected to the noninverting input terminal of the operational amplifier 1, and the other end of the fifth capacitor 12A is connected to a third signal voltage source 14. Also, an input of an inverter 16 is connected to the third signal voltage source 14, and an output of the inverter 16 is connected to the other end of the sixth capacitor 12B. That is, the fifth capacitor 12A and the sixth capacitor are driven in opposite phases. The fifth and sixth capacitors 12A and 12B, the third signal voltage source 14 and the inverter 16 constitute a third CV conversion unit that, like the first and second CV conversion units, is connected to the common node (common output terminal) which is connected to the noninverting input terminal of the operational amplifier 1. Also, the first signal voltage source 4, the second signal voltage source 5, and the third signal voltage source 14 generate signal pulses in a time division manner. Other points are the same as those in the CV conversion circuit shown in FIG. 1.

Figure 5:
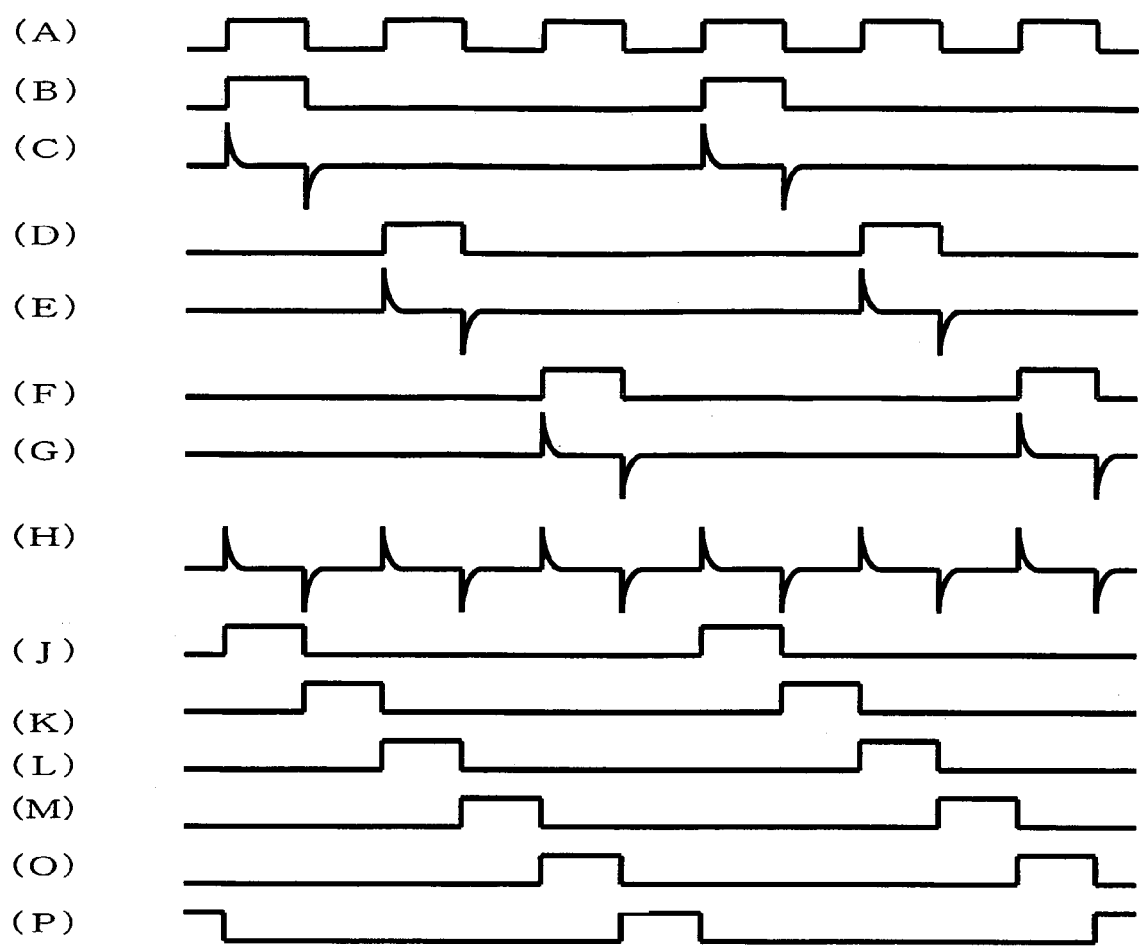
FIGS. 5A to 5P are waveforms of voltages in a CV conversion it circuit according to the second embodiment of the present invention.

FIGS. 5A to 5P are waveforms of voltages over time in horizontal axis, in respective portions of the CV conversion circuit shown in FIG. 4.

FIG. 5A shows a waveform of a clock signal as a basis of the first signal voltage source 4, the second signal voltage source 5, and the third signal voltage source 14. FIG. 5B shows a waveform of an output voltage pulse signal from the first signal voltage source 4 shown in FIG. 4. FIG. 5C shows a waveform of a voltage which appears at the output terminal 10 of the operational amplifier 1 when the first capacitor 2A and the second capacitor 2B are driven by a voltage whose waveform is shown in FIG. 5B.

FIG. 5D shows a waveform of an output voltage pulse signal from the second signal voltage source 5 shown in FIG. 4. FIG. 5E shows a waveform of a voltage which appears at the output terminal 10 of the operational amplifier 1 when the third capacitor 3A and the fourth capacitor 3B are driven with the output voltage pulse signal shown in FIG. 5D.

FIG. 5F shows a waveform of an output voltage pulse signal from the third signal voltage source 14 shown in FIG. 4. FIG. 5G shows a waveform of a voltage which appears at the output terminal 10 of the operational amplifier 1 when the fifth capacitor 12A and the sixth capacitor 12B are driven with the output voltage signal pulse shown in FIG. 5F.

FIG. 5H shows a waveform of a voltage which appears at the output terminal 10 of the operational amplifier 1 when the first capacitor 2A and the second capacitor 2B, the third capacitor 3A and the fourth capacitor 3B, and the fifth capacitor 12A and the sixth capacitor 12B are driven by the first signal voltage source 4, the second signal voltage source 5 and the third signal voltage source 14, respectively. The voltage appearing at the output terminal 10 of the operational amplifier 1 is a sum of the voltages shown in FIGS. 5C, 5E, and 5G.

FIGS. 5J to 5P show waveforms of signals used to detect the waveform of the voltage at the output terminal 10 of the operational amplifier 1. Thus, FIGS. 5J to 5M are similar to those in the first embodiment.

In a case where a capacitance difference $C_Z$ between the capacitance of the fifth capacitor 12A and the capacitance of the sixth capacitor 12B is measured by the synchronous detection circuit, when the level of the signal shown in FIG. 5O is at "H", the switches S2 and S3 of FIG. 3 are turned ON (the switches S1 and S4 are turned OFF), and when the level of the signal shown in FIG. 5P is at "H", the switches S1 and S4 of FIG. 3 are turned ON (the switches S2 and S3 are turned OFF).

In this manner, the output from the operational amplifier 1 which is generated by the capacitance difference $C_Z$ between the fifth capacitor 12A and the sixth capacitor 12B can be detected.

Consequently, three capacitances can be measured with one operational amplifier and one resistor.

As can be seen from the above-mentioned explanation, it is obvious that three or more capacitances can be measured with one operational amplifier and one resistor by driving capacitors having respective capacitance to be detected in a time division manner.

Third Embodiment

Figure 6:
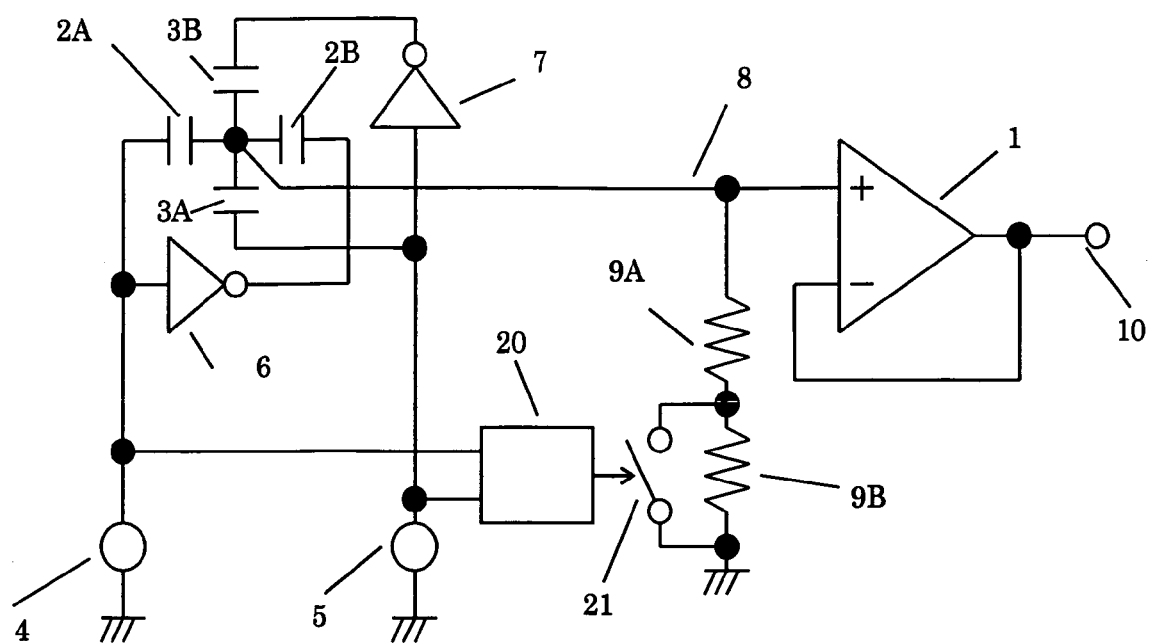
FIG. 6 is a circuit diagram of a CV conversion circuit according to a third embodiment of the present invention.
Figure 7:
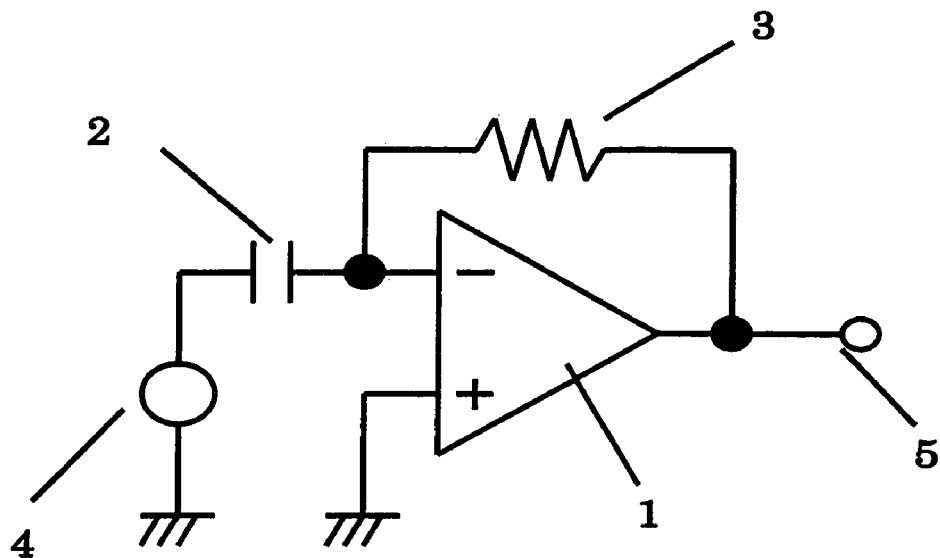
FIG. 7 is a circuit diagram of a conventional CV conversion circuit.
Figure 8:
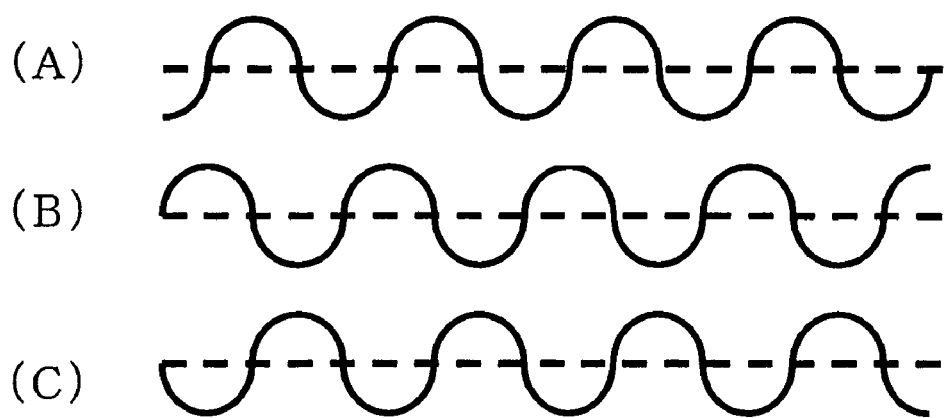
FIGS. 8A to 8C are waveforms of voltage and current in the conventional CV conversion circuit shown in FIG. 7.

A circuit diagram of a CV conversion circuit according to a third embodiment of the present invention is shown FIG. 6. A point of difference in configuration from the CV conversion circuit shown in FIG. 1 is that the resistor 9 is replaced with two resistors 9A and 9B, a switch 21 is connected in parallel with the resistor 9B, and the switch 21 is controlled in accordance with an output signal of a logic circuit 20 for receiving as its input the output voltage signal from the first signal voltage source 4 and the output voltage signal from the second signal voltage source 5 (the input to the logic circuit 20 does not need to be the output voltage signal from the first signal voltage source 4 and the output voltage signal from the second signal voltage source 5 themselves, only needs to be synchronous to the output voltage signal from the first signal voltage source 4 or the output voltage signal from the second signal voltage source 5).

Let $C_T$ be a total capacitance at the noninverting input terminal, $R_{9A}$ be a resistance value of the resistor 9A, and $R_{9B}$ be a resistance value of the resistor 9B, then when the switch 21 is ON, a spike voltage during detection of the capacitance discharges at the rate of the time constant $C_T \cdot R_{9A}$, and when the switch 21 is OFF, a spike voltage during detection of the capacitance discharges at the rate of the time constant $C_T \cdot (R_{9A} + R_{9B})$ Let's suppose the capacitance difference $C_X$ between the first capacitor 2A and the second capacitor 2B is large, the peak voltage of the spike shown in FIG. 2D becomes large when the first capacitor 2A and the second capacitor 2B are driven by the first voltage signal source 4 and the inverter 6. On the other hand, if the capacitance difference Cy between the third capacitor 3A and the fourth capacitor 3B is small, the peak voltage of the spike sown in FIG. 2F becomes small when the third capacitor 3A and the fourth capacitor 3B are driven by the second signal voltage source 5 and the inverter 7. In this case, there arises a problem that if a resistance of the resistor connected between the noninverting input terminal and the ground electric potential is made larger, the waveform of the output voltage shown in FIG. 2D distorts, while if the resistance value of the resistor is made smaller, the waveform of the voltage shown in FIG. 2F is hardly obtained (masked by noise).

Satisfactory CV conversion can, however, be carried out by making the resistance of the resistor connected between the noninverting input terminal and the ground electric potential smaller to $R_{9A}$, which is cause by putting ON the switch 21 while the level of the signal shown in FIG. 2B is "H", when the capacitance difference is large, and by making the resistance of the resistor connected between the noninverting input terminal and the ground electric potential larger to $R_{9A} + R_{9B}$ when the capacitance difference is small.

Changing the resistance of the resistor leads to the change of the sensitivity of the CV conversion. Filtering the output signal after the synchronous detection, magnitude of the amplification of the output signal is changed according to the resistance values if necessary, the output signal after CV conversion is then obtained.

In addition, when the capacitance difference $C_x$ between the capacitance of the first capacitor 2A and the capacitance of the second capacitor 2B is large, the power source amplitude for the first voltage signal source 4 and for the inverter 6 is made small, and when the capacitance difference Cy between the capacitance of the third capacitor 3A and the capacitance of the fourth capacitor 3B is small, the power source amplitude for the second voltage signal source 5 and for the inverter 7 is made large, whereby each of the peak voltages of the spikes shown in FIGS. 2D and 2F can be set within a certain range. That is, by changing the amplitude of the voltage by which the capacitors are driven according to the capacitance difference, a satisfactory CV conversion can be carried out.

Changing the amplitude of the voltage by which the capacitors are driven leads to the change of the sensitivity of the CV conversion. Filtering the output voltage after the synchronous detection, magnitude of the amplification of the output signal is changed according to the amplitude of the voltage by which the capacitors are driven as necessary, the output signal after CV conversion is then obtained.

As described above, in the first to the third embodiments, the noninverting input terminal of the operational amplifier 1 is grounded to 0 V. However, the noninverting input terminal of the operational amplifier 1 is not necessarily grounded to 0 V. Thus, if a arbitrary voltage is set to the noninverting input terminal of the operational amplifier 1, the output voltage of the operational amplifier 1 is generated with reference to the arbitrary voltage.

In addition, one of the capacitance of the first capacitor 2A and the second capacitor 2B, one of the capacitance of the third capacitor 3A and the fourth capacitor 3B, and one of the capacitance of the fifth capacitor 12A and the sixth capacitor 12B do not need to be necessarily references capacitances. The CV conversion circuit of the present invention can detect a capacitance difference between the two capacitances.

As set forth hereinabove, according to the present invention, a plurality of capacitances can be measured by a small circuit for CV conversion.

What is claimed is:

1. A CV conversion circuit, comprising:
an operational amplifier having an inverting input terminal and an output terminal connected to each other;
a resistor having one end connected to a noninverting input terminal of the operational amplifier and the other end grounded;
a first capacitor having one end connected to the noninverting input terminal of the operational amplifier and the other end connected to a first signal voltage source;
a second capacitor having one end connected to the noninverting input terminal of the operational amplifier and the other end connected to an inverting output of the first signal voltage source;
a third capacitor having one end connected to the noninverting input terminal of the operational amplifier and the other end connected to a second signal voltage source; and
a fourth capacitor having one end connected to the noninverting input terminal of the operational amplifier and the other end connected to an inverting output of the second signal voltage source,
wherein the first signal voltage source and the second signal voltage source generate signals in a time division manner, and a detection synchronous to the signals is carried out.

2. A CV conversion circuit according to claim 1; wherein a value of a time constant CR, where C is a sum of total capacitance of the capacitors connected to the noninverting input terminal of the operational amplifier and R is a resistance of the resistor, is smaller than a time duration of each of the signals from the first signal voltage source and the second signal voltage source.

3. A CV conversion circuit according to claim 1; wherein a resistance of the resistor is changed synchronously with voltages from the first and second signal voltage sources.

4. A CV conversion circuit according to claim 1; wherein the amplitude voltage value of each signal voltage source is set independently.

5. A CV conversion circuit, comprising:
an operational amplifier having an inverting input terminal and an output terminal connected to each other;
a resistor having one end connected to a noninverting input terminal of the operational amplifier and the other end grounded;
a first capacitor having one end connected to the noninverting input terminal of the operational amplifier and the other end connected to a first signal voltage source;
a second capacitor having one end connected to the noninverting input terminal of the operational amplifier and the other end connected to an inverting output of the first signal voltage source; and
a third capacitor having one end connected to the noninverting input terminal of the operational amplifier and the other end connected to a second signal voltage source,
wherein the first signal voltage source and the second signal voltage source generate signals in a time division manner, and detection synchronous to the signals is carried out.

6. A CV conversion circuit according to claim 5; wherein a value of a time constant CR, were C is a sum of total capacitance of the capacitors connected to the noninverting input terminal of the operational amplifier and R is a resistance of the resistor, is smaller than a time duration of each of the signals from the first signal voltage source and the second signal voltage source.

7. A CV conversion circuit according to claim 5; wherein a resistance of the resistor is changed synchronously with voltages from the first and second signal voltage sources.

8. A CV conversion circuit according to claim 5; wherein the amplitude voltage value of each signal voltage source is set independently.

9. A CV conversion circuit, comprising:
an operational amplifier having an inverting input terminal and an output terminal connected to each other;
a resistor having one end connected to a noninverting input terminal of the operating amplifier and the other end grounded; and
a plurality of CV conversion units having a common output terminal connected to the noninverting input terminal of the operational amplifier, each CV conversion unit comprising
a signal voltage source,
an inverter having an input terminal connected to an output terminal of the signal voltage source, a first capacitor having one end connected to an output terminal of the inverter and the other end connected to the common output terminal, and a second capacitor having one end connected to the common output terminal and the other end connected to the output terminal of the signal voltage source;

wherein the signal voltage sources of the respective CV conversion units generate signals in a time division manner so that detection can be carried out synchronously with the signals.

10. A CV conversion circuit according to claim 9; wherein one of the first and second capacitors has a zero capacitance.

11. A CV conversion circuit according to claim 10; wherein a value of a time constant CR, where C is a sum of total capacitance of the capacitors of the plurality of CV conversion units that are connected to the noninverting input terminal of the operational amplifier and R is a resistance of the resistor, is smaller than a time duration of each of the signals from the signal voltage sources of the respective CV conversion units.

12. A CV conversion circuit according to claim 10; wherein a resistance of the resistor is changed synchronously with voltages from the signal voltage sources of the respective CV conversion units.

13. A CV conversion circuit according to claim 10; wherein the amplitude voltage value of the signal voltage source of each CV conversion unit is set independently.

14. A CV conversion circuit according to claim 9; wherein a value of a time constant CR, where C is a sum of total capacitance of the capacitors of the plurality of CV conversion units that are connected to the noninverting input terminal of the operational amplifier and R is a resistance of the resistor, is smaller than a time duration of each of the signals from the signal voltage sources of the respective CV conversion units.

15. A CV conversion circuit according to claim 9; wherein a resistance of the resistor is changed synchronously with voltages from the signal voltage sources of the respective CV conversion units.

16. A CV conversion circuit according to claim 9; wherein the amplitude voltage value of the signal voltage source of each CV conversion unit is set independently.

* * * * *